(12) United States Patent
Oprins et al.

(10) Patent No.: US 8,493,736 B2
(45) Date of Patent: Jul. 23, 2013

(54) DEVICE FOR COOLING INTEGRATED CIRCUITS

(75) Inventors: Herman Oprins, Kessel-lo (BE); Bart Vandevelde, Rotselaar (BE); Paolo Fiorini, Brussels (BE); Eric Beyne, Leuven (BE); Joeri De Vos, Neerwinden (BE); Bivragh Majeed, Leuven (BE)

(73) Assignee: IMEC, Leuven (BE)

( * ) Notice: Subject to any disclaimer, the term of this patent is extended or adjusted under 35 U.S.C. 154(b) by 245 days.

(21) Appl. No.: 13/151,021

(22) Filed: Jun. 1, 2011

(65) Prior Publication Data

US 2011/0304987 A1 Dec. 15, 2011

Related U.S. Application Data

(60) Provisional application No. 61/353,316, filed on Jun. 10, 2010.

(30) Foreign Application Priority Data

Jun. 10, 2010 (EP) ...................................... 10165504

(51) Int. Cl.
*H05K 7/20* (2006.01)

(52) U.S. Cl.
USPC .................. 361/699; 361/679.46; 361/679.53; 361/689; 361/698; 165/80.4; 165/104.23; 165/104.33; 165/185; 257/714; 62/259.2

(58) Field of Classification Search
USPC ....... 361/679.46–679.54, 688, 689, 698–700, 361/715–727; 165/80.2, 80.4, 104.23, 104.33, 165/185; 257/706–727; 62/115, 259.2
See application file for complete search history.

(56) References Cited

U.S. PATENT DOCUMENTS 5,467,815 A * 11/1995 Haumann et al. .......... 165/109.1
6,538,885 B1   3/2003 Azar
(Continued)

FOREIGN PATENT DOCUMENTS

WO   WO 2004/075292 A1   9/2004
WO   WO 2006/016293 A1   2/2006
WO   WO 2008/010181 A2   1/2008

OTHER PUBLICATIONS

Brunschwiler et al., "Hierarchically Nested Channels for Fast Squeezing Interfaces With Reduced Thermal Resistance", IEEE Transactions on Components and Packaging Technologies, vol. 30, No. 2, Jun. 2007.

(Continued)

*Primary Examiner* — Michail V Datskovskiy
(74) *Attorney, Agent, or Firm* — Knobbe Martens Olson & Bear, LLP

(57) ABSTRACT

The present disclosure is related to a device for cooling the surface of a semiconductor device such as an integrated circuit or the like, the cooling device comprising a plurality of channels (3') which are non-parallel to the surface to be cooled, each channel comprising a plurality of separate electrodes (5) or equivalent conducting areas arranged along the length of each channel, the device further comprising or being connectable to means for applying a voltage to the electrodes or conducting areas in each channel according to a sequence, the sequence being such that a droplet (6) of cooling liquid in a channel may be moved from one electrode to the next, thereby transporting the droplet from the top of the channel to the bottom, from where the droplet impinges on the surface to be cooled.

11 Claims, 11 Drawing Sheets

U.S. PATENT DOCUMENTS

| | | | |
|---|---|---|---|
| 6,659,172 B1 * | 12/2003 | Dewar et al. | 165/166 |
| 6,988,534 B2 * | 1/2006 | Kenny et al. | 165/80.4 |
| 7,000,684 B2 * | 2/2006 | Kenny et al. | 165/80.4 |
| 7,188,662 B2 * | 3/2007 | Brewer et al. | 165/80.4 |
| 7,334,627 B2 * | 2/2008 | Liu et al. | 165/11.1 |
| 7,353,859 B2 * | 4/2008 | Stevanovic et al. | 165/80.4 |
| 7,597,135 B2 * | 10/2009 | Ghosh et al. | 165/80.4 |
| 7,836,597 B2 * | 11/2010 | Datta et al. | 29/890.041 |
| 2006/0117765 A1 | 6/2006 | Bash et al. | |
| 2006/0207746 A1 | 9/2006 | Bhatti et al. | |
| 2008/0047701 A1 | 2/2008 | Bahadar et al. | |
| 2008/0101022 A1 * | 5/2008 | Cernasov | 361/699 |
| 2009/0266516 A1 | 10/2009 | Jewell-Larsen et al. | |
| 2010/0320916 A1 * | 12/2010 | Yagi et al. | 315/111.21 |

OTHER PUBLICATIONS

Pollack et al., "Electrowetting-based actuating of liquid droplets for microfluidic applications", Applied Physics Letters, vol. 77, No. 11, Sep. 11, 2000.

Tuckerman et al., "High-Performance Heat Sinking for VLSI", IEEE Electron Device Letters, vol. EDL-2, No. 5, May 1981.

Wu et al., "Micro Heat Exchanger by Using MEMS Impinging Jets", Jan. 1, 1999, Technical Digest of the IEEE International MEMS '99 Conference, 12$^{th}$ IEEE International Conference on Micro Electro Mechanical Systems, Orlando, FL, Jan. 17-19, 1999.

* cited by examiner

DEVICE FOR COOLING INTEGRATED CIRCUITS

CROSS-REFERENCE TO RELATED APPLICATIONS

This application claims the benefit under 35 U.S.C. §119 (e) of U.S. provisional application Ser. No. 61/353,316, filed Jun. 10, 2010, and claims the benefit under 35 U.S.C. §119 (a)-(d) of European application No. 10165504.1, filed Jun. 10, 2010, the disclosures of which are hereby expressly incorporated by reference in their entirety and are hereby expressly made a portion of this application.

FIELD OF THE INVENTION

The present disclosure is related to the cooling of miniature devices and in particular of electronic circuits, especially of integrated electronic circuits.

BACKGROUND OF THE INVENTION

Since their introduction in the early 1980s (as illustrated by 'High-performance heat sinking for VLSI', Tuckerman&Pease, 5, 1981, IEEE Electron Device Letters, Vol. 2, p. 216), microchannel heat sinks have attracted much attention for cooling in high heat-flux applications, like e.g. integrated circuits. Conventional microchannel coolers are based on a parallel channels arrangement. The coolant flows from an inlet port, situated at one extreme of the chip to an outlet port situated at the other opposite extreme. In such an arrangement, cooling is more efficient near the inlet than near the outlet and a temperature gradient is formed. Furthermore the fluid flow must be large to remove a sizeable amount of heat and the channels must be narrow to optimize heat exchange between the fluid and the chip. As a consequence, the pressure necessary to operate the cooler is typically large and difficult to be provided by a compact pump. Various possibilities for decreasing the operating pressure and/or increasing the thermal exchange have been proposed, but none of them really solves the problem. It has also to be noted that a cooling solution based on parallel channels is highly inefficient in the cases where heat load varies with position (e.g. presence of hot spots).

The volume of cooling flow can be decreased if a two phase flow is used, i.e. if a liquid which evaporates at the chip temperature is used. The evaporation specific heat is much larger than the heat capacity of the fluid times the typical temperature increase (50-60° C.). Therefore, a much lower volume of fluid can be used, the operating pressure becomes lower and the requirements on the pump less stringent. However, it is very difficult to control a two phase flow through microchannels. The flow tends to be unstable and different from channel to channel. No established method exists for stabilizing a two-phase flow in microchannels.

An improved cooling arrangement consists in fabricating, both for the incoming cold fluid and for the out-going warm fluid, a plurality of flow paths perpendicular to the plate to be cooled. As inlets of cold fluid and outlets of warmed fluid are uniformly distributed over the chip, the chip temperature is uniform. Various implementations of this concept exist, e.g. in the document "Hierarchically Nested Channels for Fast Squeezing Interfaces with Reduced Thermal Resistance," Brunschwiler et al, IEEE Transactions on Components and Packaging Technologies, 30 (2), 2007, pp.226-234, or in patent publications US-A-2006207746 and U.S. Pat. No. 6,538,885. The operation of these 'impingement' coolers typically requires a much smaller pressure than microchannels, making the requirements on the pump less stringent. As in the case of straight channels, the operation in a two-phase flow is not obvious and it is not possible to cope with the hot spots.

A third issue in liquid cooling of IC's is the need of a pump, which has to provide the appropriate pressure and flow. Ideally the pump should be a micropump, integrated in the cooling chip and occupying a minimum volume. As the needed pressure and flow are both large, the implementation of such a miniaturized pump is difficult.

The principle of electrowetting is known in the art and has been the subject of various studies, e.g. "Electrowetting-based actuation of droplets for integrated microfluidics", M. G. Pollack et al, 2002, The royal society of chemistry, Lab Chip, Vol. 2, pp. 96-101. The latter reference discloses a so-called 'electrowetting on dielectric' system (EWOD), wherein a droplet is actuated between two parallel surfaces, with dielectric material on the walls of the surfaces, a grounded electrode embedded in the dielectric on one side, and a plurality of actuation electrodes embedded in the dielectric on the other side.

By applying a voltage to subsequent electrodes, a droplet moves forward within the channel. The principle has been proposed for use in a cooling system for electronic substrates, as shown in WO-A-2006/016293. In all of these known systems, the droplet moves parallel to the surface to be cooled, possibly in a plurality of microchannels, but as in the case of continuous flow a temperature gradient exists between the inlet and the outlet. Treatment of hot spots with this system is therefore still difficult. US-A-2008/0047701 describes a similar system wherein a droplet is moved by electrowetting towards a hot spot. Nevertheless, the control of the droplet movement in such a system is difficult and heat removal from a hot spot is therefore open to improvement.

SUMMARY OF THE INVENTION

The present disclosure aims to provide a cooling system which does not suffer from at least one of the drawbacks indicated above.

The disclosure is related to a cooling system as disclosed in the appended claims.

The disclosure is thus related to a device for cooling the surface of a semiconductor device such as an integrated circuit or the like, the cooling device comprising a plurality of channels which are non-parallel to the surface to be cooled, each channel comprising a plurality of separate electrodes or equivalent conducting areas arranged along the length of each channel, the device further comprising or being connectable to means for applying a voltage to the electrodes or conducting areas in each channel according to a sequence, the sequence being such that a droplet of cooling liquid in a channel may be moved from one electrode to the next, thereby transporting the droplet from the top of the channel to the bottom, from where the droplet impinges on the surface to be cooled.

According to a preferred embodiment, the device of the disclosure comprises a base substrate and a stack of layers attached to the base substrate and to each other by adhesive interlayers, wherein a plurality of holes is provided in each of the layers, and wherein the layers are assembled on top of each other so that the holes are interconnected to form elongate channels from the top of the stack to the bottom of the stack, and wherein each hole in each layer is provided with one or more electrodes or equivalent conducting zones, the base substrate being configured to be attached to the surface to be cooled, the base substrate comprising one or more cavities or cooling zones, arranged so that the droplets emerge from the channels into the cavities or cooling zones.

The surface of each hole in each layer may be provided with an insulating layer and a separate electrode, embedded in or in contact with the insulating layer, and an electrical connection may be provided from the electrodes to contact pads which are connectable to the means for applying a voltage.

According to an embodiment, the layers are produced from a semiconducting material, and no separate electrodes are present on the inner surface of the holes.

According to an embodiment, the device of the disclosure further comprises a reservoir, configured to contain cooling liquid, and placed on top of and in connection with the channels, the device further comprising a base substrate having a central cavity, configured to be placed above the surface to be cooled, so that the droplets emerge from the channels into the cavity, the device further comprising a means for evacuating gaseous substances from the cavity.

According to another embodiment, the device further comprises a manifold structure on top of and in connection with the channels, comprising a collector or collectors for cold cooling liquid, and a collector or collectors for heated cooling liquid coming from the cooled surface, and wherein a first group of channels are connected to the collector(s) for cold cooling liquid and configured to transport droplets from the collector(s) to the surface to be cooled, and wherein a second group of channels are connected to the collector(s) for heated cooling liquid and configured to transport heated droplets from the surface to be cooled to the collector(s) for heated liquid, each channel of the first group being connected to a channel of the second group via a cooling zone configured to be placed adjacent to the surface to be cooled, such that cold droplets emerge from a channel of the first group into the cooling zone, and heated droplets may be transported back up through a channel of the second group, the manifold structure further comprising an inlet for cold cooling liquid and an outlet for heated cooling liquid, the device further comprising a base substrate comprising separation portions configured to define the cooling zones.

The cooling zones may be configured to be liquid-filled, wherein the inlet of the channels of the second group is located lower than the outlet of the channels of the first group.

The manifold structure may be a meander structure, comprising a collector for cold cooling liquid and a collector for heated liquid, as well as a plate arranged on top of the meander structure and provided with an inlet hole for cold cooling liquid and an outlet hole for heated cooling liquid.

The collector(s) for cold and heated liquid may be interconnected via an external cooling circuit, the circuit comprising an external heat exchanger.

The channels may be configured so that the movement of droplets in each channel is actuatable separately from the other channels.

According to another embodiment, the channels are configured so that the movement of droplets takes place in all channels simultaneously.

BRIEF DESCRIPTION OF THE DRAWINGS

FIG. 1b shows a cross section of the channels in one layer in the embodiment of FIG. 1a.

DETAILED DESCRIPTION OF THE PREFERRED EMBODIMENT

Any cooling device according to the disclosure is based on the principle of electrowetting in a tubular channel—a plurality of channels is provided which are non-parallel to the surface to be cooled, and preferably essentially perpendicular to the surface to be cooled. A droplet of cooling liquid may propagate inside the channels, through subsequent actuation of a series of electrodes (or equivalent conducting zones e.g. in the case of Si-layers, see further) arranged along the length of the channels. Actuation of electrodes means application of a voltage to the electrodes, sufficient to exert a propagating force on a droplet. The droplet fills the channels completely. The electrodes in each channel are configured to be actuatable in a predefined sequence, by an external voltage source, the sequence being such that a droplet is moved from one electrode to the next, until the droplet is transported from the top of the channel to the bottom, from where the droplet impinges on the surface to be cooled.

Figure 1A:
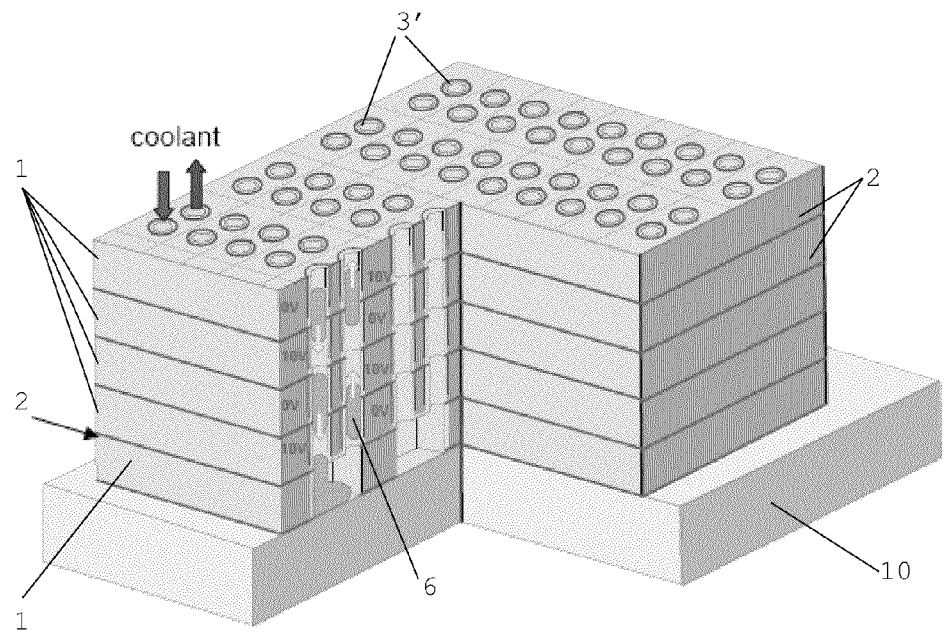
FIG. 1a illustrates a cooling device according to the disclosure comprising a stack of perforated layers.
Figure 1B:
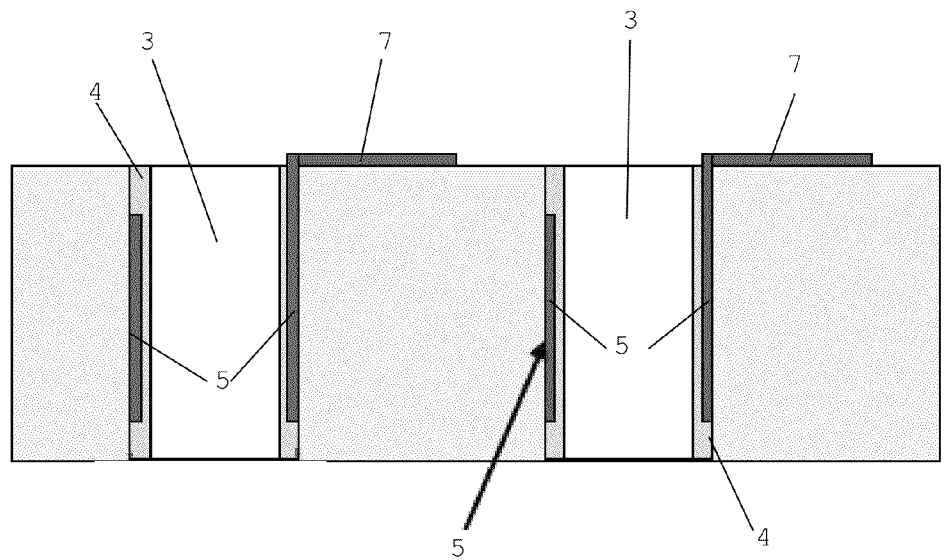

The cooling device according to the embodiment of FIG. 1a comprises a stack of layers 1, typically Si layers, separated by polymer layers 2. Each layer is perforated so that holes 3 are formed. As seen in the detail in FIG. 1b, the walls of the holes are covered by a layer 4 of insulating material with electrodes 5 embedded in the insulating layer or in contact with the insulating layer (but not in contact with a droplet moving inside the channel). Layers are stacked on top of each other by using a polymer adhesive 2, in such a way that the holes form a plurality of vertical microchannels 3'. Each vertical microchannel has now a series of electrodes which can be used to transport droplets 6 by electrostatic actuation along the channel itself, by applying a voltage subsequently to the series of electrodes. The layer stack is glued to the chip 10 to be cooled. The metal electrodes 5 are routed (as illustrated by the metal portion 7 in FIG. 1b) to the periphery of the chip in such a way that a voltage can be easily applied to the electrodes. According to a preferred embodiment, each microchannel can be actuated individually. According to another embodiment, all electrodes in the same layer are actuated simultaneously, and movement of droplets 6 takes place in all channels simultaneously. In this embodiment metal electrodes 5 are not strictly necessary; the layers 1 can be made of highly doped silicon and can act themselves as an electrode. This greatly simplifies the fabrication of the cooling device.

Figure 2:
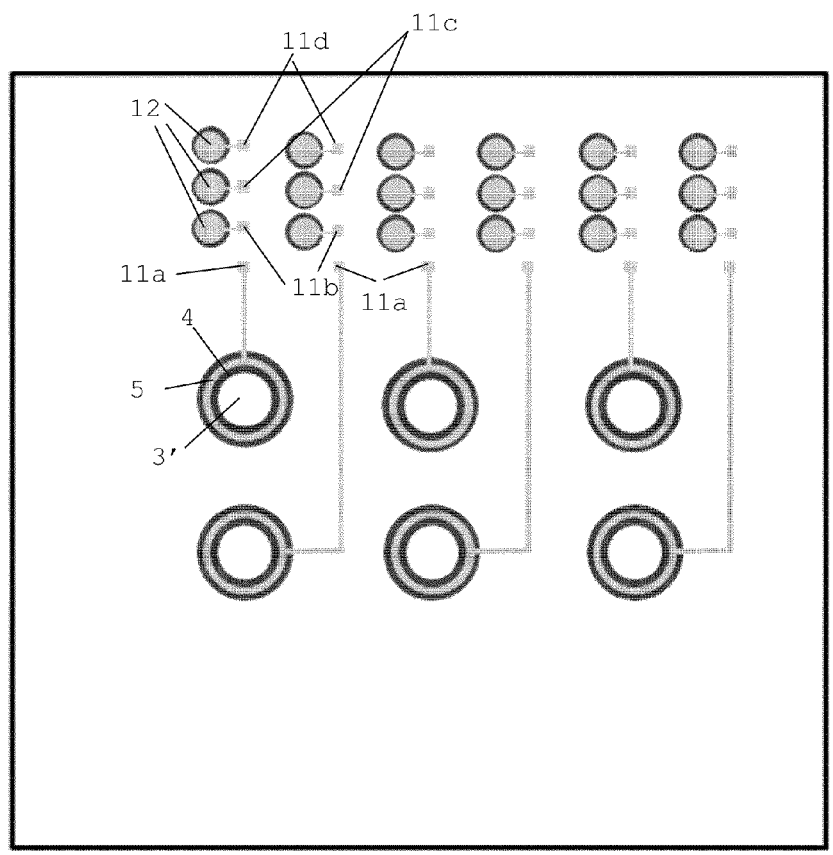
FIG. 2 illustrates the electrical connection towards several layers in a device according to the disclosure.

FIG. 2 illustrates the way in which the electrical contacts may be established in the case of a device having four layers 1. For each channel 3', four contacts 11a to 11d are provided. Contacts 11a are located in top layer 1, while contacts 11b-11d are connected to the underlying layers through vias 12 (preferably produced as 'Through silicon vias' or TSV's, which are produced according to a known technique). In the embodiment of FIG. 2, each channel 3' can be actuated individually. Process flows for the production of various devices according to the disclosure will be described further in the present specification.

In a device of the disclosure, the same device combines the fluidic microchannels and the pump, i.e. no external pump is necessary as the propelling force exerted on the droplets is generated in the channels themselves.

Figure 3:
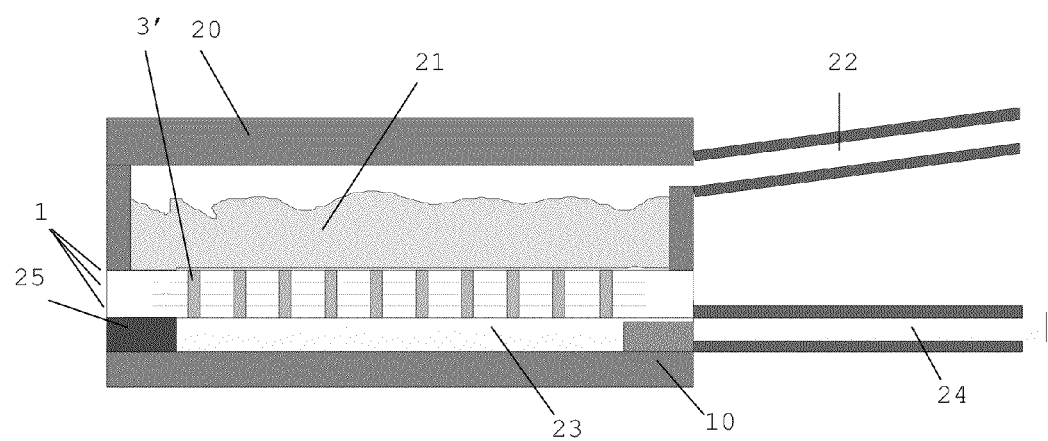
FIG. 3 is a schematic image of a device according to the disclosure, suitable for two-phase cooling.

According to a specific embodiment illustrated in FIG. 3, a device is provided for 'two-phase cooling'. In this device, the droplets are actuated in the vertical micro-channels 3' as described above, from top to bottom, and subsequently impinge on the substrate 10 to be cooled, where they evaporate. The resulting vapor is evacuated laterally from the device, through convection. The device comprises a stack of layers 1 with microchannels 3' provided therein, and electrodes or equivalent conducting zones (not visible) lining the walls of the channels, as described above. A reservoir 20 is provided on top of the stack of layers, and a cooling liquid 21 is present in the reservoir, provided from an inlet 22. From the reservoir, droplets are actuated downwards, through the channels 3', by actuation of the electrodes. At the end of the channels the droplets impinge on the surface to be cooled. The droplets evaporate upon contact with the surface, thereby cooling the surface. The space 23 between the cooling device and the surface to be cooled is provided with an outlet 24, through which the vapor is evacuated by convection. The space 23 may be obtained by mounting the stack onto a base substrate 25, comprising a central cavity (the cavity forming the space 23). The device of the disclosure comprises the base substrate 25 and the channel layers 1.

Figure 4:
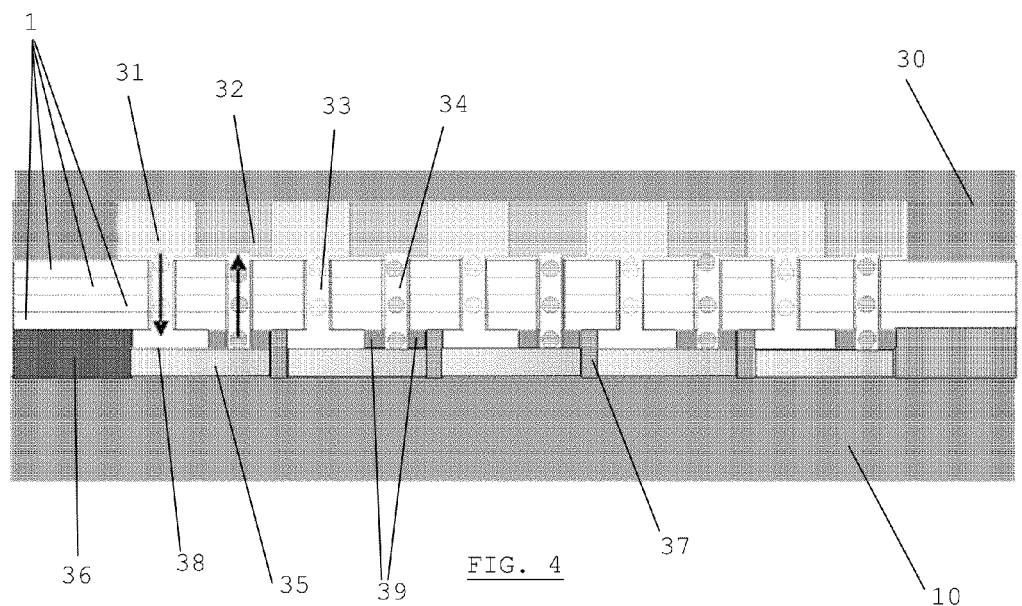
FIG. 4 is a schematic image of a device according to the disclosure suitable for single-phase and two phase cooling.

According to another embodiment, shown schematically in FIG. 4, the 'single phase cooling' embodiment, the droplets do not evaporate, but remain in liquid state when they contact the surface to be cooled. By this contact, the droplets take up heat and are evacuated through additional microchannels, in the opposite direction from the impinging droplets. In this embodiment, the device comprises a manifold structure 30 on top of the channel layers 1, the manifold comprising a collector or collectors 31 for cold droplets and a collector or collectors 32 for heated droplets. Cold droplets are actuated through a first series of microchannels 33, from the collector(s) 31 for cold droplets, impinge on the surface, heat up, after which the heated droplets are actuated upwards through a second set of microchannels 34, each channel of the second set being connected to a microchannel of the first set by a cooling zone 35 adjacent to the surface to be cooled.

Preferably, each cooling zone 35 is filled with liquid, so that the cold droplets actually impinge onto the liquid surface 38 of the liquid present in the zones. The inlet of the second channels 34 is then located lower than the outlet of the channels 33 of the first set, so that the inlet of the channels 34 of the second set is submerged in the liquid present in the cooling zone 35. The cooling zones 35 may be formed within the cavity of a base substrate 36, as in the previous embodiment.

The plurality of cooling zones 35 are separated from each other by separation portions 37, which are part of the base substrate 36. Portions 39 are present around the inlet of the second channels 34, in order to put the inlet at a lower position than the outlet of the first channels 33. These portions 39 can be fabricated out of an additional layer 1 with the same process and they might also contain electrodes to sustain the upward motion of the droplets. The heated droplets are collected at the top of the device in the collector(s) 32 for hot droplets and evacuated.

Figure 5:
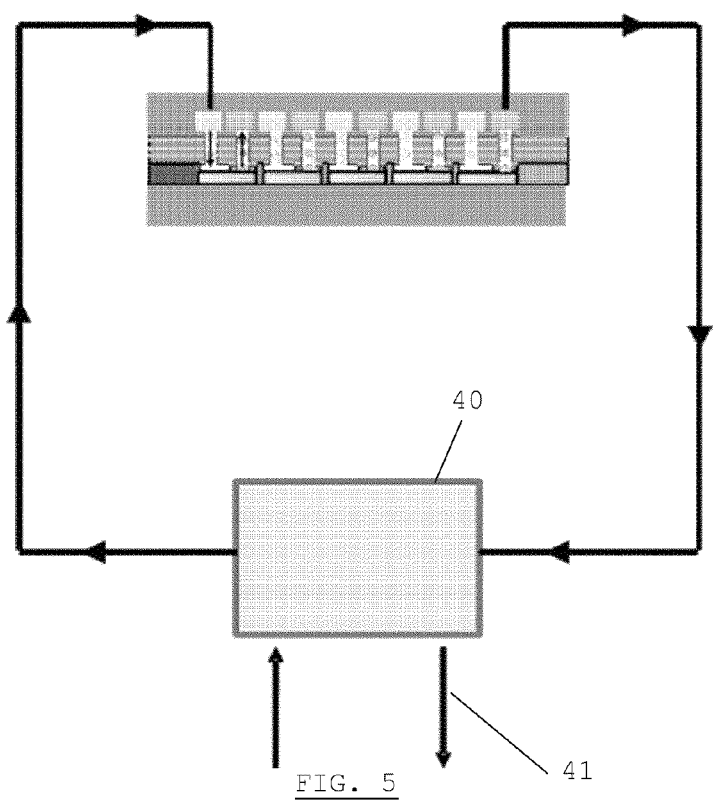
FIG. 5 shows the incorporation of the device of FIG. 4 into an external cooling circuit.

Preferably, the cooling device is inserted in a closed loop cooling system, as represented schematically in FIG. 5. The hot droplets are thus evacuated towards an external heat exchanger 40 where they cool down (exchanging heat with a secondary cooling fluid 41) and from where they are redirected towards the cooling device for re-injection towards the surface to be cooled.

The device of the previous embodiment shown in FIG. 4 can also be used for two-phase cooling. In this operation mode the impinging droplet evaporates and vapor is evacuated through the second set of vertical channels 34 by convection, where the vapor condenses into a droplet. The droplet is subsequently pushed up by the electrostatic force. With respect to the first embodiment described for two phase cooling shown in FIG. 3, the present one is more complex but allows addressing selective cooling in correspondence of hot spots. In a two-phase embodiment of the device of FIG. 4, the inlet of the second set of channels 34 may be at the same level as the outlet of the first set of channels 33 (i.e. the portions 39 may be absent).

Figure 6:
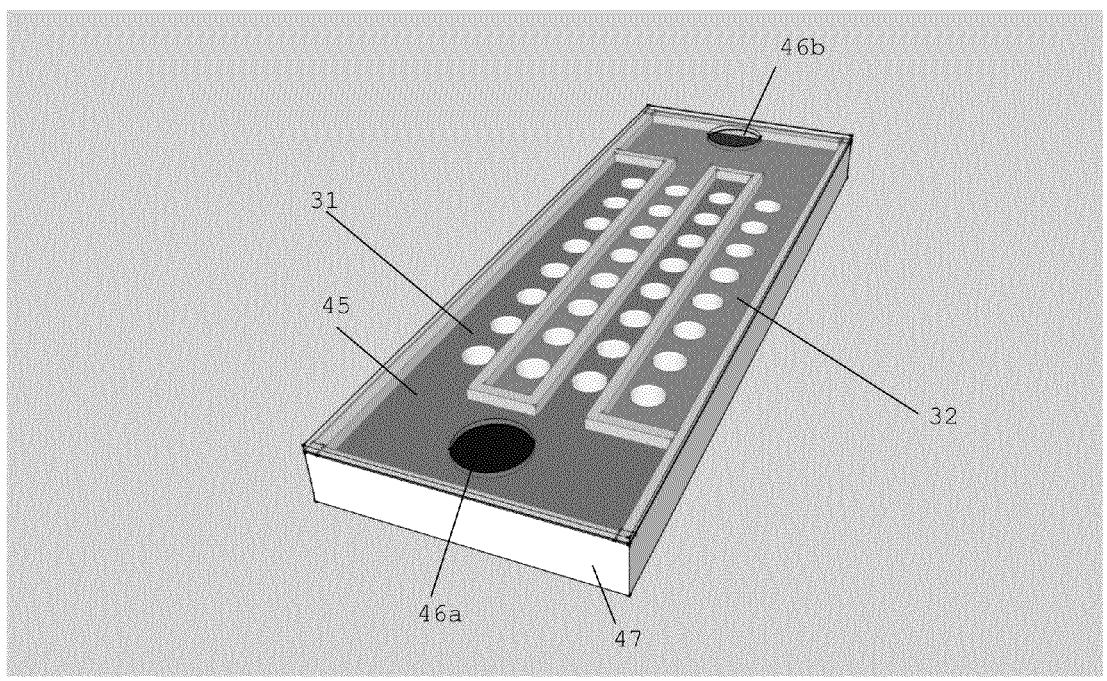
FIG. 6 illustrates a manifold structure according to an embodiment of the disclosure.

FIG. 6 shows a 3-D view of the manifold 30 according to an embodiment. A meander structure, realized, e.g., by a thick photoprintable adhesion layer, is fabricated by standard photolithographic methods on a plate (e.g. a glass plate) wherein access holes 46a/46b for the liquid were previously fabricated, i.e. one access hole for the incoming cold coolant, and one for the outgoing heated coolant. This meander defines the channels for the flow of the incoming (cold) and outcoming (warm) coolant.

The stack composed of the patterned adhesion layer and the glass can be bonded on the stack 47 of layers 1, to thereby form the cooling device. The regions 36 and 37 of FIG. 4 can be fabricated with the same process used for meander fabrication, either on the stack of layers 1 or on the backside of the chip to be cooled.

Figure 7A:
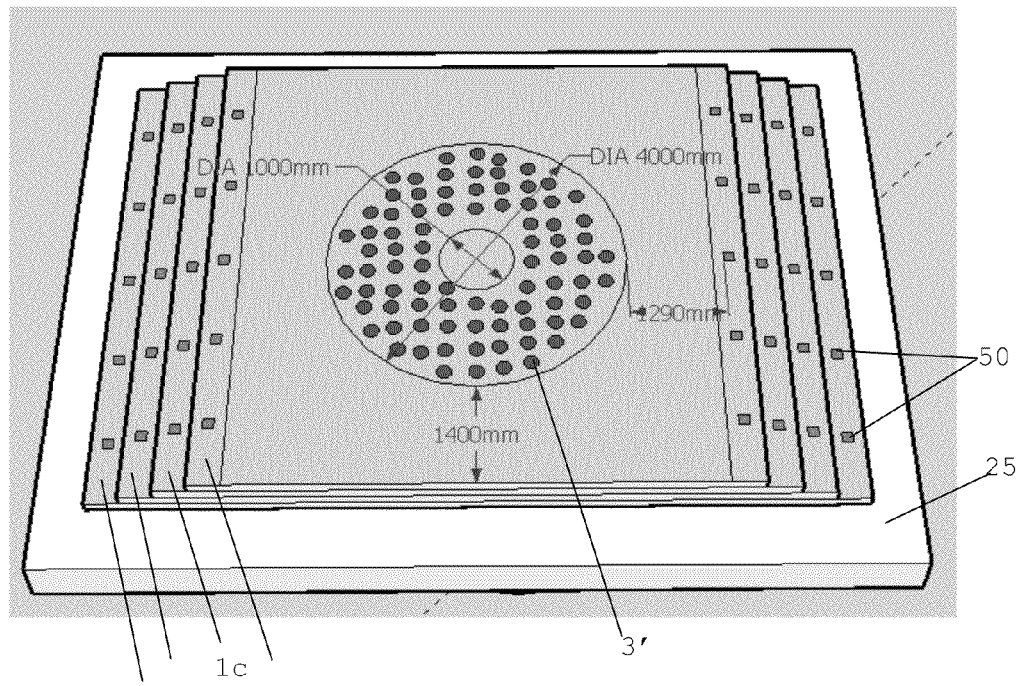
FIGS. 7a and 7b show a 3-D and cross-sectional view of a particular embodiment of the device of the disclosure.
Figure 7B:
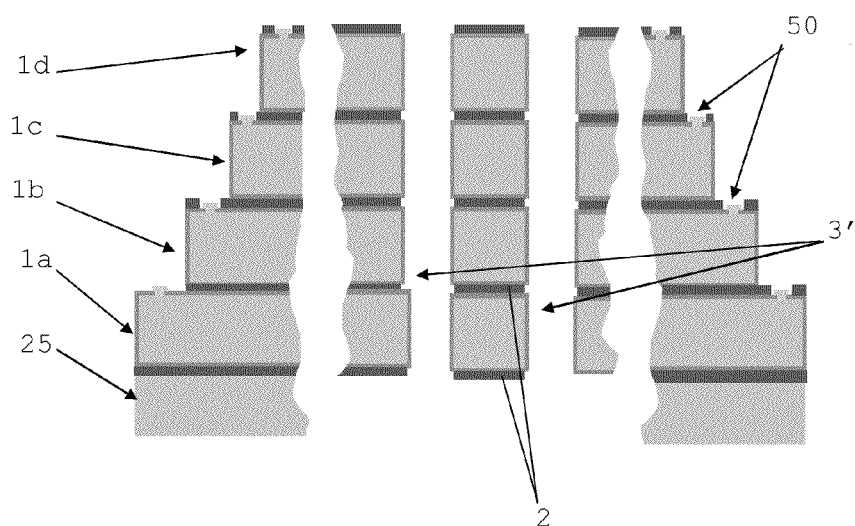

A number of processes for fabricating a cooling device according to the disclosure are now disclosed. First a method is disclosed for fabricating a device which can be used for impingement two phase cooling, where only unidirectional motion is required (from the top of the channels to the bottom, as in FIG. 3). This simplified device does not allow separate control of the different channels and is based on a die to die bonding. A 3-D view and a cross section of the device are shown in FIGS. 7a and 7b. The device consists of 4 layers 1a to 1d, with adhesive layers 2 in between. The number of levels is fixed to 4 by way of example only. All the different layers are made of low resistivity silicon. This avoids implementing electrical lines for the driving voltage. The channels 3' are visible in the drawings, as well as the contact pads 50. The layers 1 are different in size, and grow narrower from bottom to top, so that contact pads 50 are accessible at the edges of each layer. In this embodiment, the channels cannot be actuated separately, i.e. all channels are actuated simultaneously by applying voltage subsequently from top to bottom, to the contact pads of subsequent layers. As the electrical potential is uniform in each layer the coolant flow is directed only downwards and no control of the localization of the cooling is implemented. Underneath the channel layers 1*a*-1*d* is the base substrate 25, provided with a cavity configured to be placed above the surface to be cooled. The device of FIG. 7 is thus a more concrete implementation of the general scheme shown in FIG. 3. A method for fabricating the device is described in the following. It consists of three steps, the first for the preparation of a base wafer, the second for the fabrication of the different layers and the third for assembling.

Figure 8A:
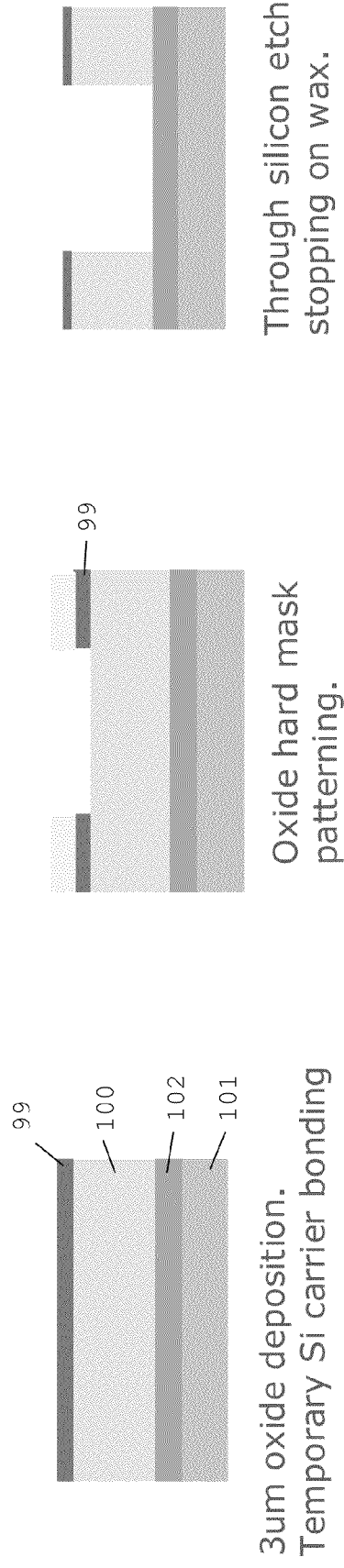
FIGS. 8a-8c illustrate the process flow for fabricating the device according to FIG. 7a/7b.

The base wafer 25 is fabricated according to the following procedure, schematically shown in FIG. 8*a*:
a) oxide 99 deposited on a low resistivity Si wafer 100 (e.g. 3 micrometer of oxide). The wafer is temporarily bonded to a carrier wafer 101 by means of glue 102. The glue is spun in a thin layer (e.g. 10 micrometers) and can be removed afterwards by heating up the wafers above 200° C.
b) The oxide 99 is patterned in order to form a hard mask for the definition of the cavity.
c) The silicon is etched by DRIE (Deep Reactive Ion Etching). The etch stops on the glue.

Figure 8B:
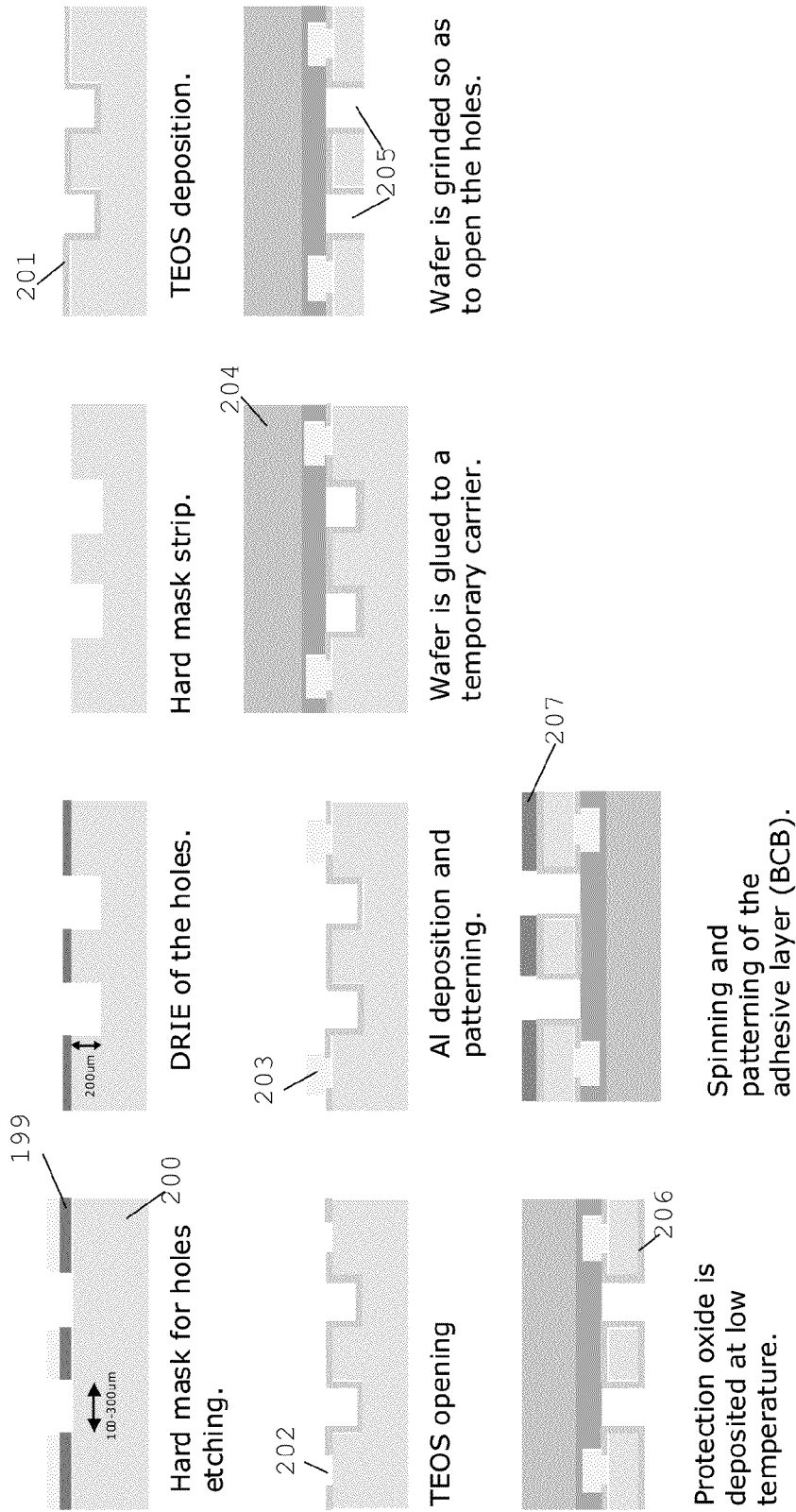

Each active layer 1*a*-1*d* is fabricated by processing a wafer according to the following steps, schematically shown in FIG. 8*b*:
a) oxide 199 is deposited on a low resistivity Si wafer 200 (e.g. 3 micrometers of oxide). The oxide is patterned.
b) The oxide is used as a hard mask for etching the silicon by DRIE. The depth of the etch is slightly larger than the thickness of the layers forming the device.
c) The oxide is stripped.
d) An electrically insulating layer of e.g. TEOS (Tetraethylortosilicate) 201 is deposited.
e) Access holes 202 for the metal contacts are opened in the TEOS-layer.
f) The metal contact 203 is deposited and patterned. Aluminum can be used for the contact.
g) The wafer is temporarily bonded to a carrier wafer 204 in such a way that the back side is accessible. The same adhesive used for the processing of the base wafer is used also in this step.
h) The wafer is grinded in order to open the holes 205 which will form the channels.
i) A second oxide layer 206 is deposited at low temperature in order to provide electrical insulation for the grinded surfaces and the edge of the channels, where oxide could have been damaged during grinding.
j) A layer of adhesive material (e.g. benzocyclobutene BCB) 207 is spun and patterned.

Figure 8C:
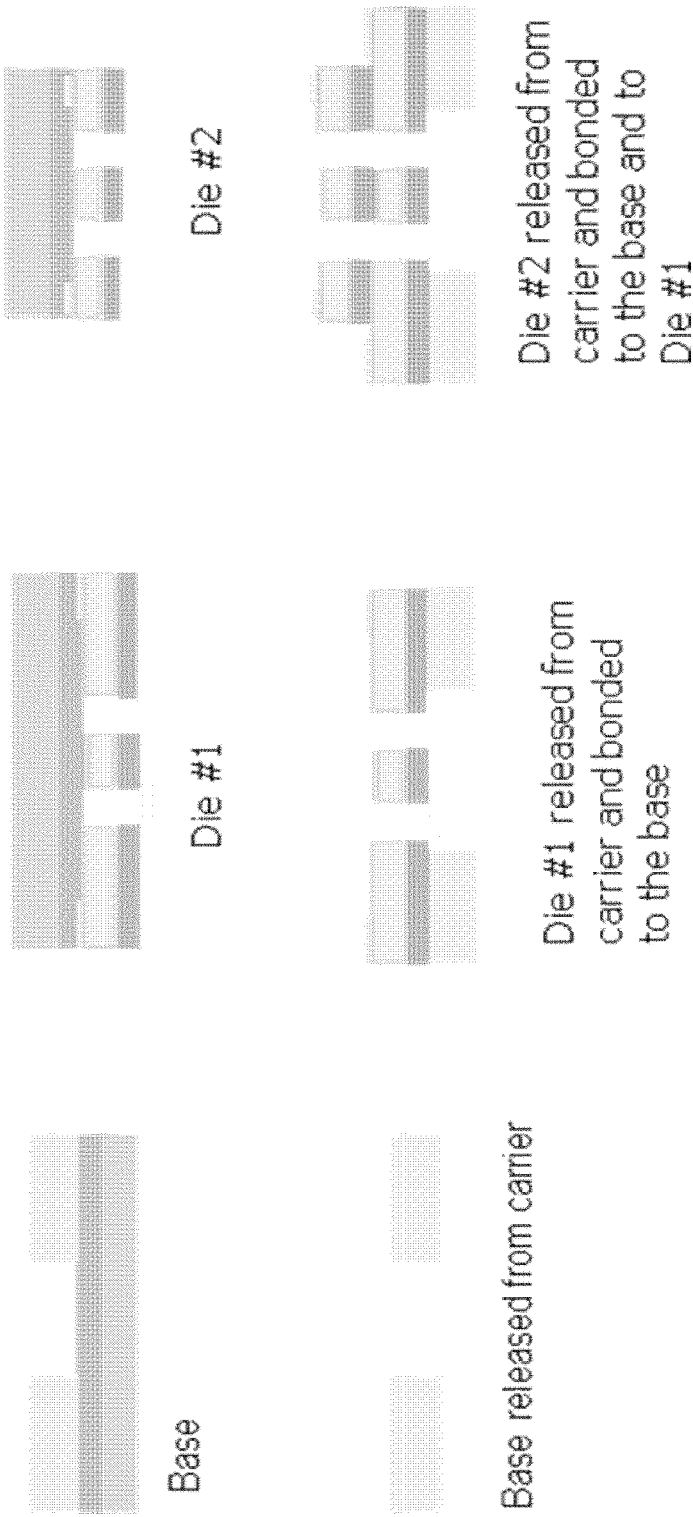

Finally, the assembly of the cooling device takes place according to the following steps, shown schematically in FIG. 8*c*:
a) A die is singulated from the base wafer
b) A die, referred as die#1, is singulated from the active wafer
c) A die, referred as die #2, is singulated from the active wafer. It has a smaller surface than die#1.
d) The base die is de-bonded from the carrier.
e) The die#1 is debonded from the carrier and bonded to the base at a temperature of about 250° C.
f) Die #2 is debonded from the carrier and bonded to the assembly of base and die #1 at a temperature of about 250° C.

This process can be repeated for any number of dies, to achieve the device shown in FIGS. 7*a* and 7*b*.

Figure 9:
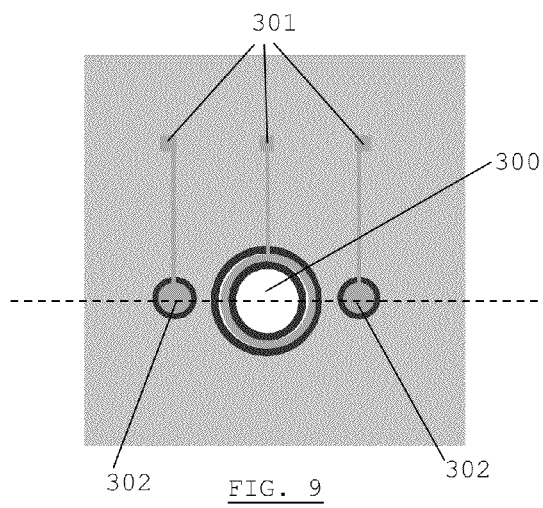
FIG. 9 illustrates a device having one channel and three contacts connected to the top layer and to two layers situated underneath the top layer, according to another embodiment of the disclosure.
Figure 10:
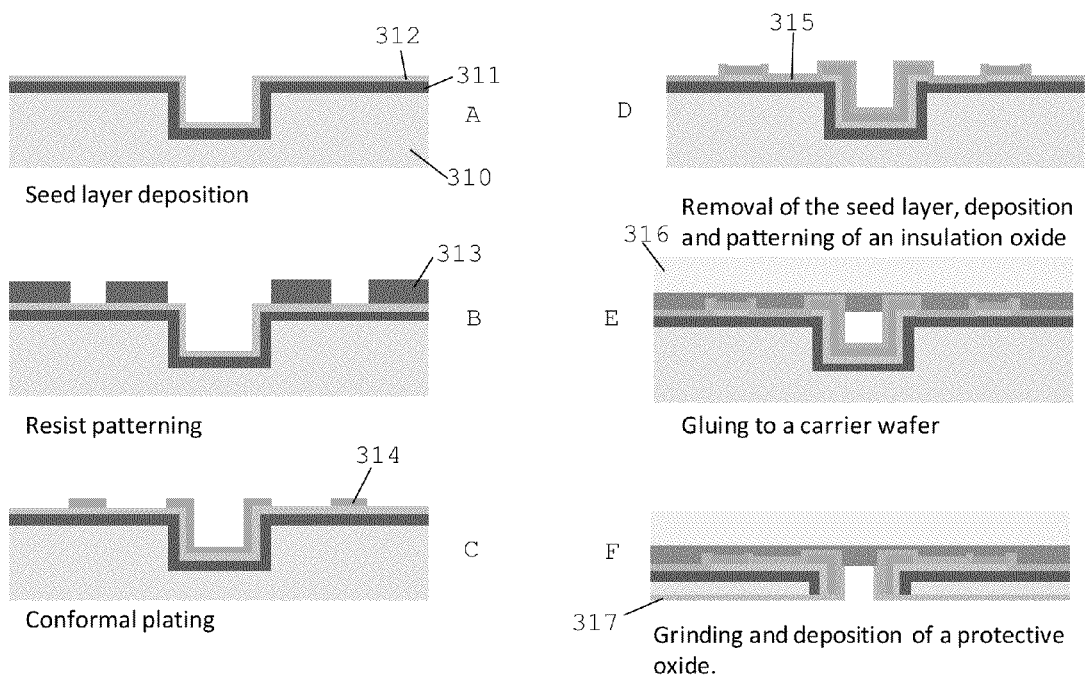
FIGS. 10a-10f illustrate the process flow for fabricating a device according to another embodiment of the disclosure.

FIGS. 9-12 illustrate the process flow for fabricating a device according to the disclosure, wherein each channel can be actuated individually. FIG. 9 shows an exemplary configuration of one channel 300 and three contacts 301, respectively connected to the top layer and to two layers situated underneath the top layer. Two vias 302 are provided for contacting the layers underneath the top layer. In order to simplify drawings channels 300 and vias 302 are drawn in such a way to have the central cross section on the same plane. This is not the typical arrangement of the embodiment described above. Furthermore the layer number is limited to three for ease of drawing but is larger in real embodiments. The following is a description of the production process of each of the three layers, and of their assembly to form a device of the disclosure.

First the holes are fabricated in a silicon substrate 310 and coated with oxide 311 as explained previously (FIG. 10A). Then a seed layer 312 is sputtered (also FIG. 10A). A plating resist 313 is spun and patterned in order to define the contact area (FIG. 10B). Conformal plating is performed in order to fabricate copper contacts 314 (FIG. 10C). The seed layer is removed; a protective oxide 315 is deposited and patterned in order to open the contact areas (FIG. 10D). The wafer is glued to a carrier wafer 316 (FIG. 10E) and grinded in order to open the previously etched cavities (FIG. 10F). A protective oxide 317 is deposited (also FIG. 10F).

In a second part of the process vias 400 are fabricated in order to connect the different layers. The vias fabrication process has been described in previous patents and references, such as in document WO-A-2009115449.

Figure 11A:
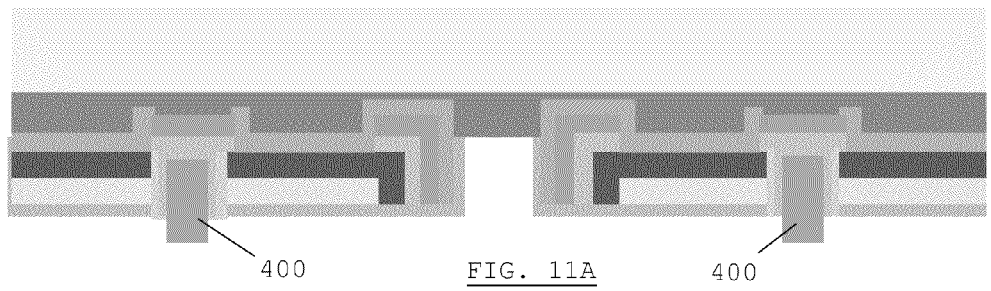
FIG. 11a illustrates vias in a device wherein copper is protruding out of the wafer.
Figure 11B:
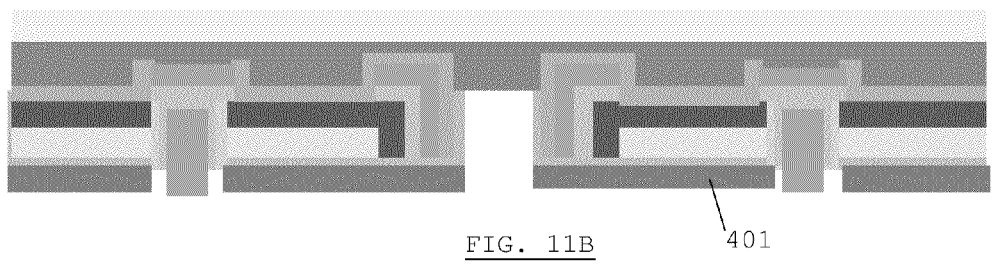
FIG. 11b illustrates a device wherein an adhesive polymer is spun and patterned to bond different layers.
Figure 12:
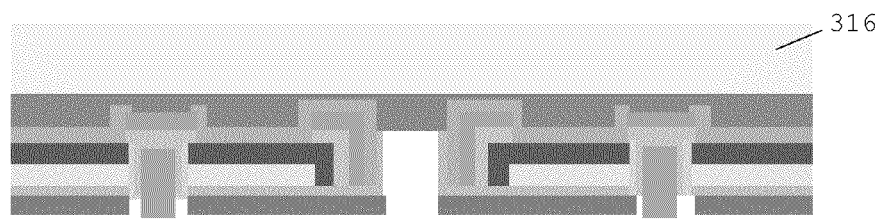
FIG. 12 shows three layers attached to a carrier but provided with different amounts of vias.
Figure 12:
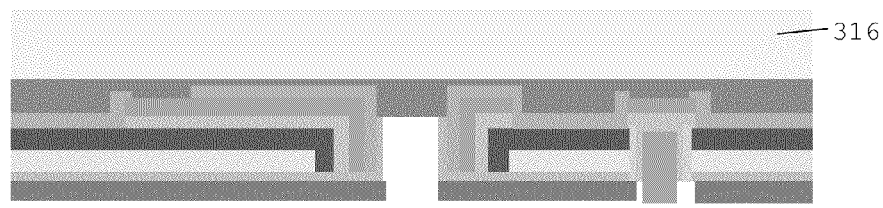
Figure 12:
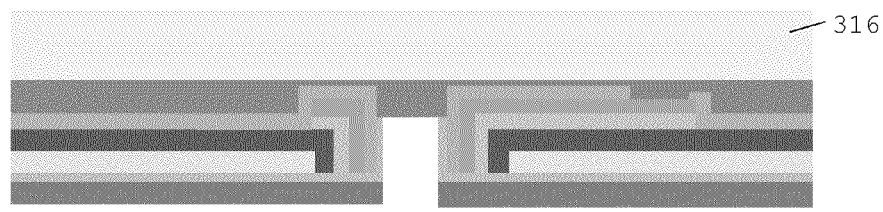

The implemented vias are shown in FIG. 11A. Note that the copper is protruding out of the wafer. In order to bond different layers an adhesive polymer 401 is spun and patterned as shown in FIG. 11B. FIG. 12 shows the three layers produced as described above, and still attached to their carriers 316. Each layer is provided with different amounts of vias: the top layer has two vias, the middle layer has one, and the bottom layer has no vias.

The assembly proceeds according to the following method. The three layers are bonded onto a base substrate, e.g. the same base substrate as described in the process flow of FIG. 8*a*. First the bottom layer is bonded to the base by a thermo-compression process. The carrier wafer 316 is then removed. The central layer is then bonded and the carrier wafer removed. The top wafer is mounted according to the same procedure.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein.

Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A device for cooling a surface of a semiconductor device, comprising:
    a plurality of channels which are non-parallel to a surface to be cooled, wherein each channel is provided with a series of electrodes or conducting areas arranged along a length of each channel; and
    a voltage source for applying a voltage to the electrodes or conducting areas in each channel in a sequence, wherein the device is configured such that a droplet of cooling liquid in a channel is moved from one electrode or conducting area to the next, whereby the droplet is transported from a top of the channel where the droplet impinges on the surface to be cooled to a bottom of the channel.

2. The device according to claim 1, further comprising a base substrate and a stack of layers, wherein the stack of layers is attached to the base substrate, wherein each layer is attached to an adjacent layer by an adhesive interlayer, wherein each layer comprises a plurality of holes, wherein the layers are assembled on top of each other so that the holes are interconnected to form elongate channels from a top of the stack to a bottom of the stack, wherein each hole is provided with one or more electrodes or conducting areas, wherein the base substrate is configured to be attached to the surface to be cooled, and wherein the base substrate comprises one or more cavities or cooling zones, arranged so that droplets emerge from the channels and into the cavities or cooling zones.

3. The device according to claim 2, wherein a surface of each hole is provided with an insulating layer and a separate electrode, wherein the separate electrode is embedded in or in contact with the insulating layer, and wherein an electrical connection is provided from the separate electrode to a contact pad configured for connection to the voltage source.

4. The device according to claim 2, wherein the layers each comprise a semiconducting material, and wherein no separate electrodes are present on an inner surface of the holes.

5. The device according to claim 2, further comprising a reservoir configured to contain a cooling liquid, wherein the reservoir is placed on top of and in connection with the channels; wherein the base substrate comprises a central cavity and is configured to be placed above the surface to be cooled, such that droplets emerge from the channels and into the central cavity, the device further comprising an outlet for evacuating gaseous substances from the cavity.

6. The device according to claim 2, further comprising a manifold structure on top of and in connection with the channels, the manifold comprising one or more collectors configured for collecting cold cooling liquid, and one or more collectors configured for collecting heated cooling liquid coming from the cooled surface, wherein a first group of channels is connected to the collectors for cold cooling liquid and is configured to transport droplets from the collector to the surface to be cooled, and wherein a second group of channels is connected to the collectors for heated cooling liquid and is configured to transport heated droplets from the surface to be cooled to the collectors for heated liquid, wherein each channel of the first group is connected to a channel of the second group via a cooling zone configured to be placed adjacent to the surface to be cooled, such that cold droplets emerge from a channel of the first group into the cooling zone, and heated droplets are transported back up through a channel of the second group, the manifold structure further comprising an inlet for cold cooling liquid and an outlet for heated cooling liquid, wherein the base substrate comprises separation portions configured to define the cooling zones.

7. The device according to claim 6, wherein the cooling zones are configured to be liquid-filled and wherein an inlet of the channels of the second group is located lower than an outlet of the channels of the first group.

8. The device according to claim 6, wherein the manifold structure is a meander structure, the meander structure comprising a collector for cold cooling liquid, a collector for heated liquid, and a plate arranged on top of the meander structure and provided with an inlet hole for cold cooling liquid and an outlet hole for heated cooling liquid.

9. The device according to claim 6, wherein the collectors for cold liquid and the collectors for heated liquid are interconnected via an external cooling circuit, the external cooling circuit comprising an external heat exchanger.

10. The device according to claim 1, wherein the channels are configured so that a movement of droplets in each channel is actuatable separately from the other channels.

11. The device according to claim 1, wherein the channels are configured so that a movement of droplets takes place in all channels simultaneously.

* * * * *